United States Patent [19]

Hwang et al.

[11] 4,233,644
[45] Nov. 11, 1980

[54] DUAL-PULL AIR COOLING FOR A COMPUTER FRAME

[75] Inventors: Un-Pah Hwang; Robert E. Simons, both of Poughkeepsie, N.Y.

[73] Assignee: International Business Machines Corporation, Armonk, N.Y.

[21] Appl. No.: 52,998

[22] Filed: Jun. 28, 1979

[51] Int. Cl.³ .............................................. H05K 7/20
[52] U.S. Cl. .................................... 361/384; 361/386; 174/16 HS
[58] Field of Search .................. 62/411, 418; 165/122; 174/16 HS, 16 R; 361/383, 384, 386

[56] References Cited
PUBLICATIONS

Air Cooling Scheme, Antonetti, IBM Tech. Discl. Bulletin, vol. 14, No. 2, Jul. 1971, p. 378.

*Primary Examiner*—Gerald P. Tolin
*Attorney, Agent, or Firm*—Harold H. Sweeney, Jr.

[57] ABSTRACT

An air cooling arrangement for a column of integrated circuit modules is provided in which a pair of air moving devices are included, one located at the top and one at the bottom of the column each pulling air through the column. A heat sink having opposite side air outlets is attached to each of the modules and extends from the top side thereof. A cover plate having openings therein indexed with each of the heat sinks allows air to pass through the openings into the heat sinks. An air flow guide is located at each air outlet side of each heat sink and extends from the cover plate vertically into each heat sink to approximately the half way point to provide a vertical impinging air flow pattern which yields a high heat transfer coefficient. Air distribution ducts are arranged on opposite sides of the heat sinks parallel to the column and connected to the opposite side of air outlets of the heat sinks via air passages thereby providing a dividing of the flow across each heat sink.

11 Claims, 7 Drawing Figures

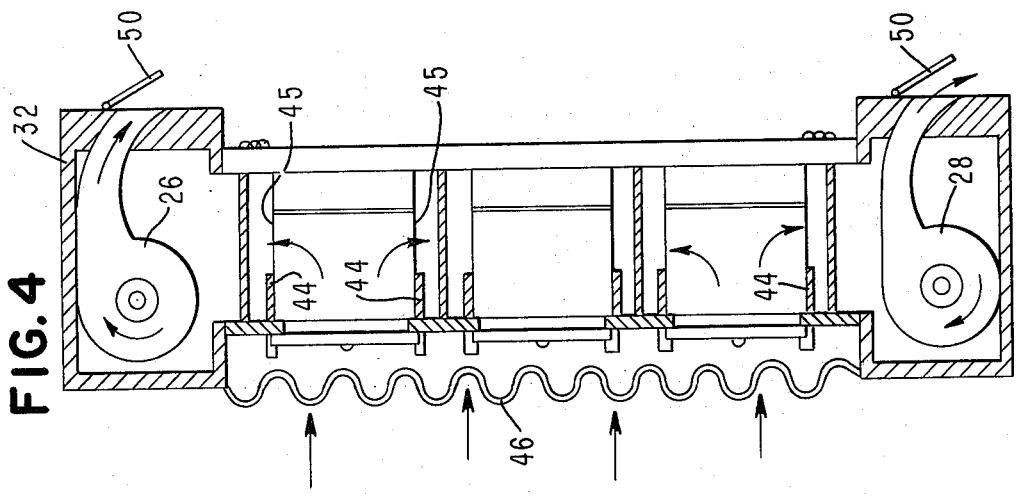
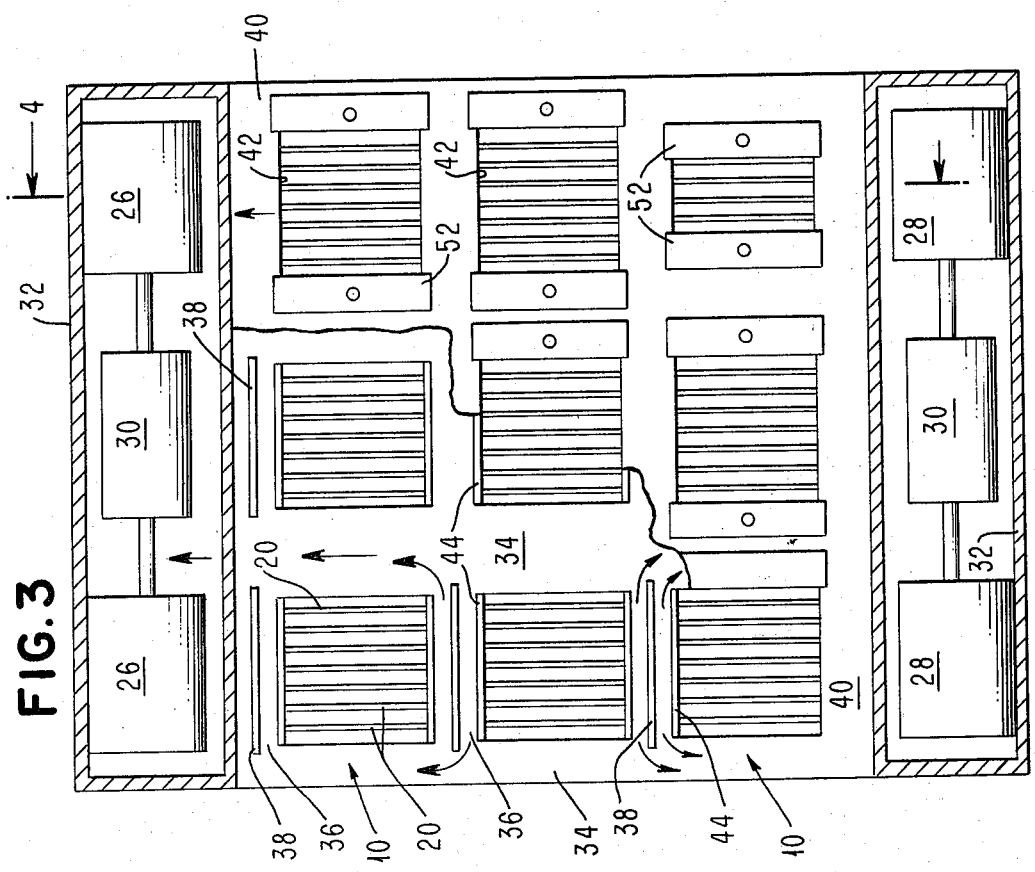

4,233,644

DUAL-PULL AIR COOLING FOR A COMPUTER FRAME

DESCRIPTION

Technical Field

This invention relates to an air cooling arrangement for computer frames and, more particularly, to an air cooling arrangement having individual dual path air flow and control thereof for each module to maintain a predetermined temperature thereof.

One object of the present invention is to provide an air cooling arrangement having high volume air flow in which each module is located in two individual air paths, thereby increasing the cooling capabilities.

Another object of the present invention is to provide an air cooling arrangement in which two blowers are provided to pull air individually into each module and then exhaust it so each module can be maintained at the same temperature.

Another object of the present invention is to provide an air cooling arrangement having a failsafe mode of operation in which the air flow can be adjusted for each module in the event of a blower failure to provide a lower uniform operating temperature of each module.

Another object of the present invention is to provide an air cooling arrangement in which the air flow is perpendicular to the finned heat sink, thereby giving a higher heat transfer coefficient.

Another object of the present invention is to provide an individual air control for each module for adjusting the amount of air flow therethrough.

BACKGROUND ART

In the prior art, air cooling arrangements consist of modules having heat sinks, such as fins, attached to the top side thereof, as shown in FIG. 2 of U.S. Pat. No. 3,993,123 which issued Nov. 23, 1976. These modules are used in an array within the computer frame, with air being blown thereover parallel to the plane of the fin, similar to what is shown in the controlled bypass configuration for air-cooled computer frames, Vol. 21, No. 6, November 1978, IBM Technical Disclosure Bulletin (TDB). As can be seen, the arrangement is a push-pull air cooling scheme with a blower pulling at the top and a blower pushing at the bottom. This is the conventional air cooling arrangement used in many large scale computers. It should be appreciated that the air received at the bottom module is cooler than that received at the top module, since the air at the top module contains all the hot exhaust air from the below lying modules. The particular arrangement shown in the TDB uses a frontal bypass configuration to provide a direct path from the bottom blower to board row 3 of the frame, and a further direct bypass path from the row 3 to the upper blower. This bypass arrangement provides increased air flow to the middle board row 3 of the frame which has always experienced higher temperatures due to lower air flow in present air-cooled systems.

The IBM Technical Disclosure Bulletin, Vol. 14, No. 2, July 1971, shows an air cooling scheme which utilizes a double pull air flow arrangement. This arrangement shows the air entering at the middle gate 12 and separating, half to flow up and half to flow down. The air essentially flows over the boards and components parallel thereto. Thus, the usual temperature differential Δt along the column of gates is cut in half since a Δt exists from the middle gate to the top gate and from the middle gate to the bottom gate.

SUMMARY OF THE INVENTION

The problems in the prior art are overcome by providing an air cooling arrangement for a column of integrated circuit modules in a computer frame, wherein an air moving device is located at the top and one at the bottom of the column, each pulling air through the column. A heat sink having opposite side air outlets is attached to each of the modules and extends vertically from the top side thereof. A cover plate having openings therein indexed with each of the heat sinks allows the air to pass through the openings into the heat sinks. Air flow guides located at both of the air outlet sides of said heat sinks extend from said cover plate vertically into the heat sink to approximately the half way point. They confine the air flow to a vertical impinging pattern which yields a high heat transfer coefficient. Air distribution ducts are arranged on opposite sides of the heat sinks parallel to the column, and connected to the opposite side air outlets of the heat sinks via air passages, thereby providing a dividing of the flow across each heat sink.

BRIEF DESCRIPTION OF THE DRAWINGS

In the accompanying drawings forming a material part of this disclosure:

FIG. 3 is a partial cross-sectional view of a matrix of electronic modules showing the air cooling arrangement of the present invention;

FIG. 4 is a side view taken along the line 4—4 of FIG. 3;

DISCLOSURE OF THE INVENTION

For further comprehension of the invention, and of the objects and advantages thereof, reference will be had to the following description and accompanying drawings, and to the appended claims in which the various novel features of the invention are more particularly set forth.

Figure 2:
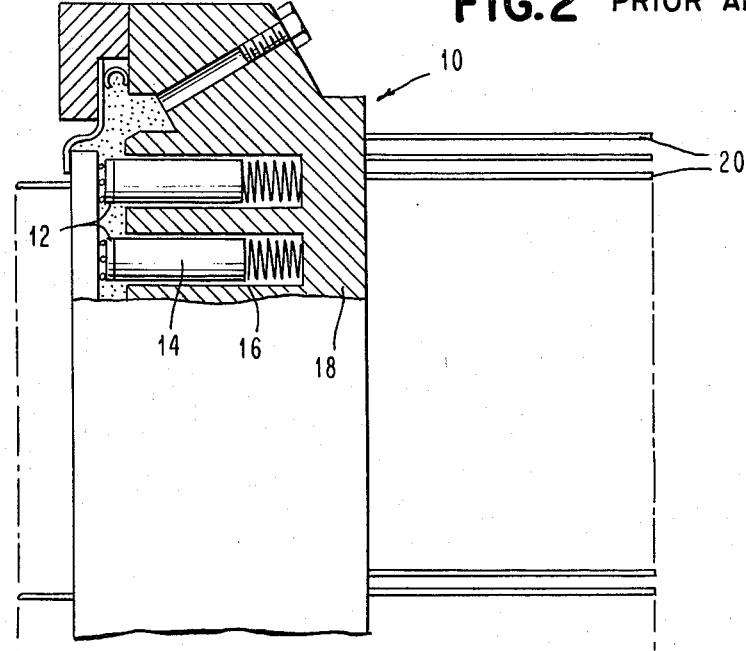
FIG. 2 is a schematic partially cross-sectional view of an electronic module having fins attached thereto as the heat sink.

A prior art electronic module 10, housing integrated circuit chips 12, is shown in FIG. 2. The heat transfer path is from the chips to the adjacent conduction stud 14, across the gap between the cylinder 16 walls and the stud, and through the housing 18 to the heat sink fins 20 attached thereto. The fins 20 provide a large surface area for the dissipation of the heat. The heat transfer from the fins 20 to air is enhanced by blowing the air over the finned surface. The volume of air moved through the fins 20 is limited by the size of the blower, and also the noise created at higher velocities.

Figure 1:
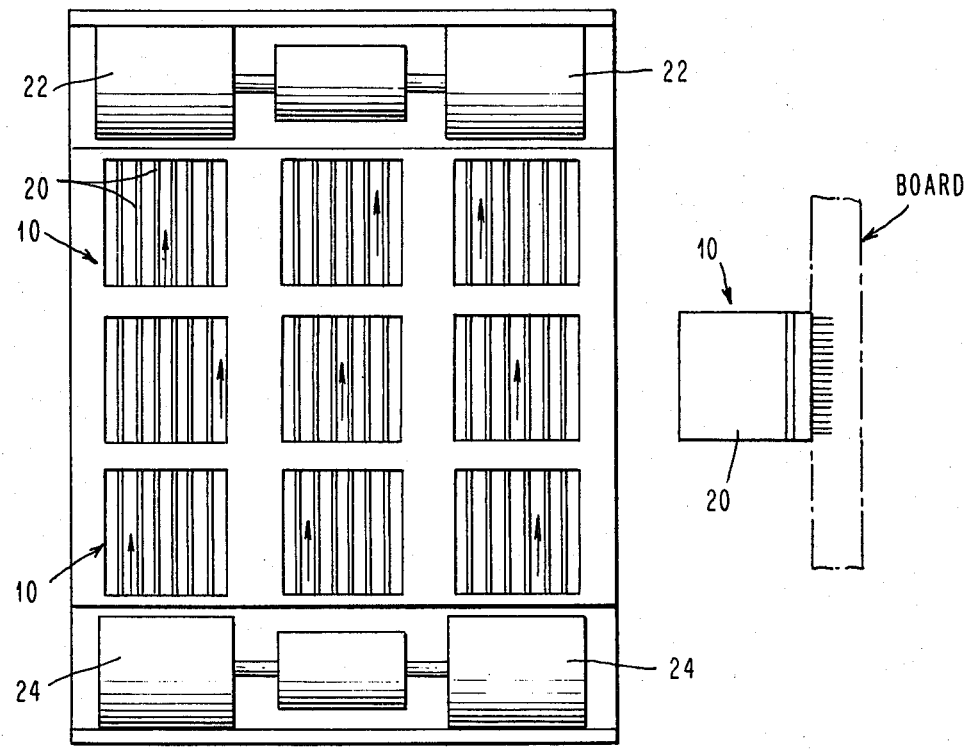
FIG. 1 is a schematic view of the prior art push-pull cooling arrangement for electronic modules in a computer frame.

An example of use of such a module 10 is shown in FIG. 1, which is a schematic diagram of a matrix of modules 10, each having an attached finned heat sink 20, and in which the air cooling arrangement is provided by a blower 22 at the top which pulls the air through the fins 20 of the modules 10, and a blower 24 at the bottom which pushes the air through the fins 20 of the modules 10. The air flow is across the module 10, parallel to the fins 20, as indicated by the arrows in FIG. 1. It should be appreciated that the temperature of the cooling air is lower at the bottom row of modules 10 than at the top row of modules, since the air at the top row of modules contains the heat obtained from the modules below in the same column. Thus, the modules 10 at the top row are at a higher temperature than the modules below.

The improved air cooling arrangement of the present invention can be seen best in FIG. 3, wherein the modules 10, each of which contains a heat sink comprising a plurality of fins 20 as described above, are arranged in a matrix. The air blowers 26, at the top of the columns of modules 10, are arranged to pull the air through the fins 20 of the heat sinks. Likewise, the air blowers 28, at the bottom of the columns of modules 10, are arranged to pull the air through the air path that includes the fins 20 of the modules 10. The fins 20 are arranged in an array, parallel to the column in which the modules 10 are located. The blowers 26, 28 or fans are of the dual fan type, in which the blower motor 30 is located in the middle, and the actual fans are located on the same shaft on either side of the blower motor. This arrangement is located in an insulated housing 32 to diminish the blower noise.

The air paths created by the blowers 26 and 28 consist of main exhaust channels 34 which run parallel to and along each side of each column of modules 10. Exhaust cross-flow channels 36 are created at each of the top and bottom ends of the fins 20 of the modules. The cross-flow channels 36 are formed by a cross-flow baffle 38, which extends across the column from the main exhaust channel 34 on one side to the main exhaust channel 34 on the other side. This cross-flow baffle 38 prevents the air flowing from one heat sink into the other or setting up air interference at the outputs of adjacent heat sinks. A cover plate 40 having openings 42 therein indexed with the module locations is placed over the front of the computer frame containing the matrix of modules 10. This cover 40 forms one wall of the main exhaust channels 34 and one wall of the exhaust cross-flow channels 36.

Air flow guides 44, shown in FIGS. 3 and 4 are attached across the heat sink top and bottom ends at the outer edges of the fins. This air flow guide 44 extends vertically down the edges of the fins 20 to about the half way point. The purpose of the air flow guides 44 are to cause the incoming air to essentially flow vertically into the spaces between the fins 20 sufficiently deep to contact the entire fin surface before passing out of the module through the outlets 45. As can be seen in FIG. 4, a filter 46 is provided over the front surface of the matrix of modules 10 in the computer frame. It should be appreciated, that this is a relatively large filter through which the incoming air is spread over the entire filter surface rather than being concentrated in any one area. The surface area of the filter is further increased, thus lengthening the time between filter servicing, by convoluting the filter as can be seen in cross-section from FIG. 4.

In operation, each of the blowers 26 and 28 pulls the air through the main exhaust channel 34 and through each of the exhaust cross-flow channels 36 in the columns. The air passes through the filter 46 and enters the module perpendicularly through the fins 20. The air is split so that approximately half flows through the fins 20 into each exhaust cross-flow channel 36 which exists at each end of the fins. It should be appreciated, that the vertical impinging flow of the air is enhanced by the air flow guides which essentially cover the outer half of each fin outlet, therefore, forcing the air to exhaust through the outlet 45 which consists of the bottom half of the ends of the fins which are adjacent to the module. The air flow is shown in FIGS. 3 and 4 by the arrows. It should be noted that the direction of flow through each of the heat sinks on the modules 10 is the same. The only difference in the exhaust paths is the direction that the air in the exhaust channels is flowing. For example, the lower part of the main exhaust channel 34 will always have the air being pulled downward by the adjacent blower 28. Likewise, the top section of the main exhaust channel 34 will always have the air flowing upward because of the pull of the blower 26. It has been found that the air flow from the middle module in the column will have half the air flowing up and half the air flowing down the main exhaust channel 34. Each of the air blowers 26 and 28 contains a failsafe flap 50 at the outlet thereof. If the air in either blower 26, 28 fails, its corresponding flap 50 will close by gravity, thus preventing reverse air flow into the system. This is important since the non-failing blower will now pull air through each of the modules in the matrix. The computer system should be able to function on the diminished amount of air cooling provided by the non-failing blower for a sufficient time to prepare for an orderly shutdown.

In today's computer systems, low power and high power modules 10 are often mixed. Thus, the amount of cooling required by a low power module is not the same as that required by a high power module. The problem with applying the standard amount of cooling air to a low power module results in the module reaching operating temperature slowly, and often being sustained at a temperature lower than required by its operation. Accordingly, cooling adjustment slides 52 are provided for each of the openings 42 in the cover plate 40. Referring to FIG. 3, the bottom right hand opening 42 is shown with the cooling adjustment slides 52 in the partially closed position. In the arrangement shown, the slides 52 cover about two-thirds of the opening, thereby, restricting the air intake opening 42 to one-third the original size. This not only restricts the amount of air being pulled through the intake opening 42 but also covers a number of the fins 20 such that the surface area for cooling is also reduced, thereby restricting the cooling, and allowing the module or the chips within the module to reach their normal operating temperature. The cooling adjustment slides 52 run in tracks, which are arranged on each side of the opening 42, as shown in FIG. 3. This same principle can be extended to situations where you wish to operate the computer without the module in a particular position. In that case, the module 10 can be left out or just not powered up, and the entire intake opening 42 can be totally blocked by a cooling adjustment slide or cover (not shown). It should be appreciated that restricting the flow to the lower power modules or stopping the flow to designated modules, consequently increases the flow to the other modules tending to create a more uniform module temperature throughout the computer.

Figure 5:
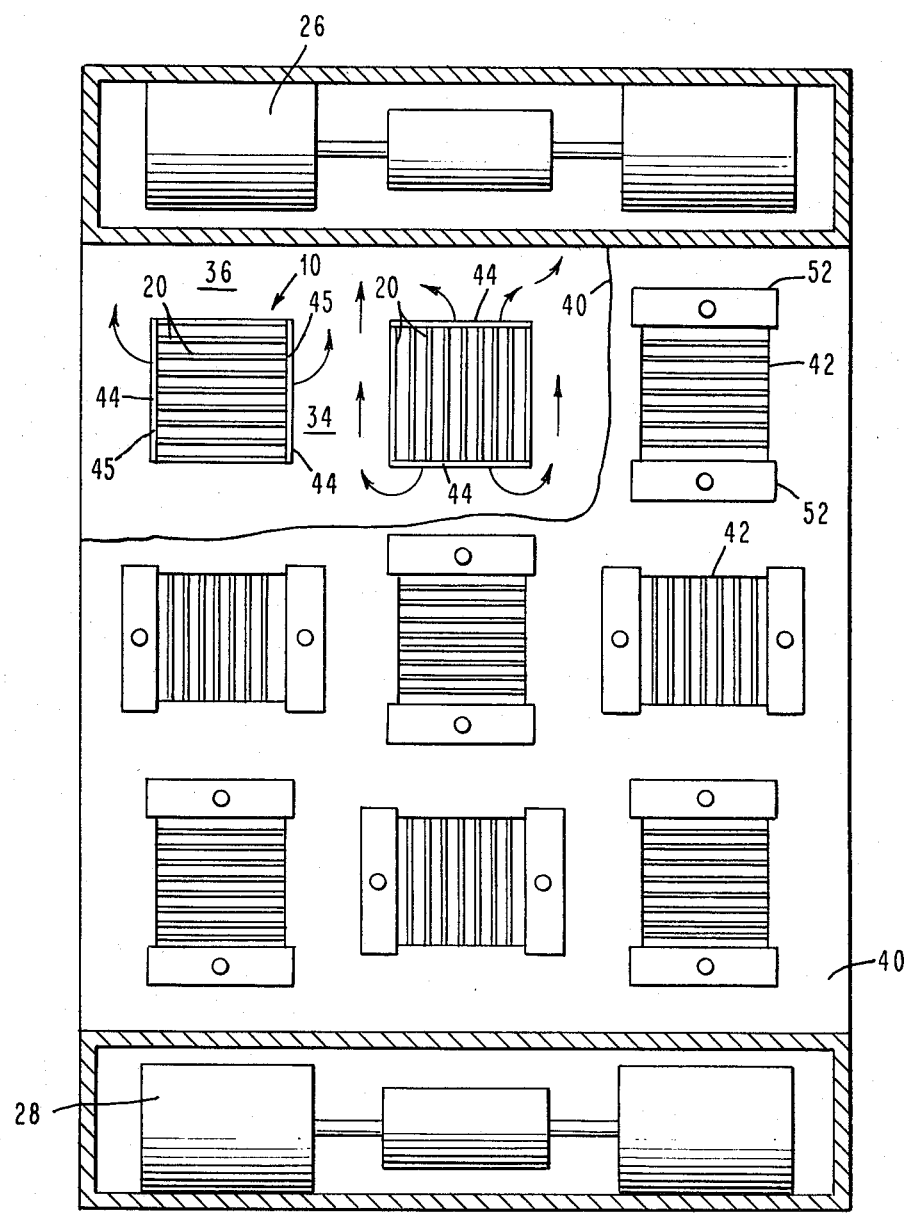
FIG. 5 is a schematic view showing an alternative arrangement of the heat sinks.

FIG. 5 shows an alternative arrangement of the heat sinks on the matrix of modules 10 in a computer frame. The arrangement consists of alternately rotating the heat sink 90°. The 90° alternate rotation of the heat sinks consisting of fins 20, produces a 90° rotation of the air outlets 45 with respect to adjacent modules. This arrangement eliminates the need for the cross-flow baffles and thus provides a more unobstructed air flow path. For example, air blower 26 pulls the air through the opening 42 in plate 40, which air flows substantially vertically with respect to the fins 20 and out air outlets 45 into either the main exhaust channel 34 or the cross-flow exhaust channels 36 depending on the orientation of the heat sink. The top module 10 of the left hand column is shown as having its heat sink rotated 90° with respect to the usual orientation as depicted by the top heat sink of the second column. It should be appreciated that the same result can be obtained by rotating the whole module containing the heat sink rather than just rotating the heat sink itself. The air drawn through the right half of the top module 10 of the left hand column exhausts directly into the main exhaust channel 34. The left end fin 20 of the adjacent top module of the middle column acts as a barrier or baffle preventing the air from entering this heat sink, thereby confining the air to the main exhaust column. The air baffle previously required has been eliminated. The 90° alternate rotation of the modules 10 or heat sinks results in the end fin 20 of the heat sink opposite the air outlet 45 of the adjacent module serving as the air baffle.

Figure 6:
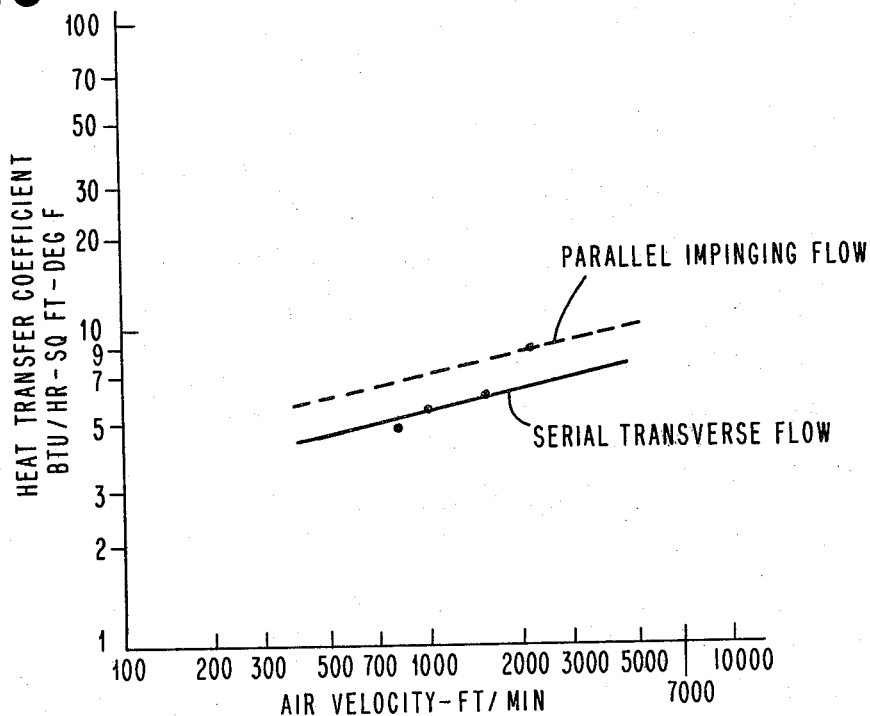
FIG. 6 is a graph of the heat transfer coefficient versus the air velocity for the parallel impinging flow arrangement of the invention and the conventional serial transverse flow arrangement.

FIG. 6 shows the improvement of heat transfer coefficient in BTU/Hour/Square Foot/Degree F. of the parallel impinging flow described above for the present invention versus the heat transfer coefficient obtained using the so called serial transverse flow of the prior art. It can be seen from the top or dashed line curve representing parallel impinging flow, that for an approximate air velocity of 2000' per minute the heat transfer coefficient would be approximately 9. The lower curve representing the serial transverse flow would give a heat transfer coefficient of 6.5 for the same 2000' per minute air velocity. Thus, the parallel impinging flow of this invention improves the heat transfer coefficient by 30 to 40 percent over the standard serial transverse flow.

Figure 7:
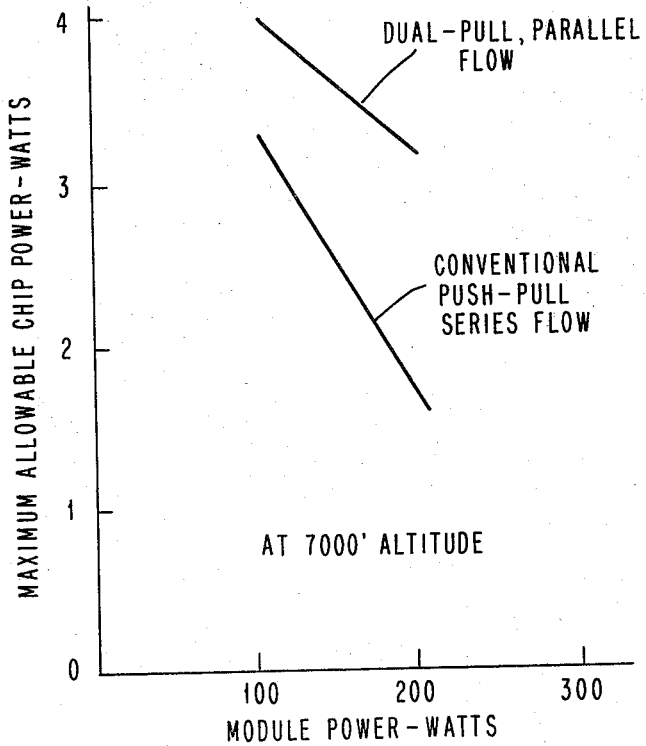
FIG. 7 is a plot of the maximum allowable chip power versus the module power for both the dual pull parallel case and the conventional push-pull series flow arrangement.

FIG. 7 is a graph showing the comparative cooling capability of the dual-pull, parallel air flow scheme of the present invention, and the conventional push-pull, series flow arrangement of the prior art. The curves are a plot of the maximum allowable chip power in watts versus the module power in watts at a 7,000 foot altitude. This altitude is the maximum operating design altitude of the cooling arrangement. It should be noted that the maximum allowable chip power of the inventive dual-pull, parallel air flow arrangement is approximately 4 watts in a 100 watt module, while in the same module, the conventional push-pull, series flow arrangement allows only a maximum allowable chip power of approximately 3.4 watts. For a 150 watt module, the maximum allowable chip power for the dual-pull, parallel air flow arrangement is approximately 3.6 watts, while the conventional push-pull, series flow arrangement is only 2.5 watts. Thus, a much higher chip power can be utilized because of the increased cooling available with the dual-pull, parallel air flow arrangement than can be utilized using the prior art conventional series flow arrangement.

While we have illustrated and described preferred embodiments of our invention, it is to be understood that we do not limit ourselves to the precise construction herein disclosed and the right is reserved to all changes and modifications coming within the scope of the invention as defined in the appended claims.

Having thus described our invention, what we claim as new, and desire to secure by Letters Patent is:

1. Air cooling structure including a column of integrated circuit modules comprising:
   a heat sink attached to each module and extending from the top side thereof and having air outlets at opposite ends thereof;
   a cover plate having openings therein indexed with each of said heat sinks to allow air to pass through the openings into the heat sinks;
   an air flow guide located at the air outlet sides of said heat sinks extending from said cover plate into said heat sink to approximately the halfway point to provide a vertical impinging air flow pattern which yields a high heat transfer coefficient;
   air distribution ducts connected to the opposite outlet sides of each of said heat sinks thereby providing a dividing of the flow across each heat sink;
   a pair of air moving devices, one located at one end of said air distribution ducts and the other at the other end of said air distribution ducts, each pulling air through said modules.

2. Air cooling structure including a column of integrated circuit modules according to claim 1, wherein said heat sink comprises parallel fins arranged substantially parallel with said column, and the air outlets being located at the top and bottom side of said heat sink in said column.

3. Air cooling structure including a column of integrated circuit modules according to claim 1, wherein said cover plate having openings indexed with said heat sinks includes cooling adjustment slides for the openings which are adjustable from a partially closed opening to a full open opening depending on the module power, thereby, controlling the amount of intake air and consequently the module temperature.

4. Air cooling structure including a column of integrated circuit modules according to claim 1, wherein a plurality of columns of modules are provided in a matrix.

5. Air cooling structure including a column of integrated circuit modules according to claim 1, wherein said air distribution ducts include first sections parallel to and adjacent each longitudinal side of said column and includes air passage sections connecting said first sections to the air outlets at the ends of said heat sinks in said column of modules.

6. Air cooling structure including a column of integrated circuit modules according to claim 5, wherein a baffle is included at right angles to said column adjacent each top and bottom end of said heat sink forming the outer wall of each air passage section, the outer wall being a common baffle for air passage sections connected to adjacent air outlets of adjacent modules thereby preventing cross-coupling of air therein.

7. Air cooling structure including a column of integrated circuit modules according to claim 1, wherein said cover plate forms the top wall of said air distribution ducts.

8. Air cooling structure including a column of integrated circuit modules according to claim 1, wherein a filter is provided over the entire front face of said column for providing a large filter surface area for the intake air.

9. Air cooling structure including a column of integrated circuit modules according to claim 8, wherein said filter has a convoluted shape to further increase the surface area available for filtration.

10. Air cooling structure including a column of integrated circuit modules according to claim 1, wherein each of said air moving devices has a failsafe flap at the outlet thereof which closes when the air moving device fails, thereby allowing the other air moving device to provide air cooling to the entire column at a diminished capacity.

11. Air cooling structure including a column of integrated circuit modules according to claim 4, wherein the heat sinks of alternate modules are rotated 90° to provide an air cooling arrangement in which the outside surface of alternate heat sinks act as baffles for adjacent heat sinks thereby providing unobstructed air exhaust passages.

* * * * *